(12) United States Patent
Chen

(10) Patent No.: US 11,527,417 B2
(45) Date of Patent: Dec. 13, 2022

(54) PACKAGED SEMICONDUCTOR DEVICES AND METHODS OF PACKAGING SEMICONDUCTOR DEVICES

(71) Applicant: Taiwan Semiconductor Manufacturing Company, Ltd., Hsinchu (TW)

(72) Inventor: Hsien-Wei Chen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 251 days.

(21) Appl. No.: 16/741,415

(22) Filed: Jan. 13, 2020

(65) Prior Publication Data

US 2020/0152481 A1 May 14, 2020

Related U.S. Application Data

(60) Continuation of application No. 15/727,339, filed on Oct. 6, 2017, now Pat. No. 10,535,537, which is a
(Continued)

(51) Int. Cl.
*H01L 21/56* (2006.01)
*H01L 25/10* (2006.01)
(Continued)

(52) U.S. Cl.
CPC .............. *H01L 21/56* (2013.01); *H01L 24/19* (2013.01); *H01L 24/20* (2013.01); *H01L 24/97* (2013.01); *H01L 25/105* (2013.01); *H01L 25/50* (2013.01); *H01L 21/561* (2013.01); *H01L 21/568* (2013.01); *H01L 23/3128* (2013.01); *H01L 23/49827* (2013.01); *H01L 23/5389* (2013.01); *H01L 25/0657* (2013.01); *H01L 2224/04105* (2013.01); *H01L 2224/12105* (2013.01); *H01L 2224/19* (2013.01); *H01L 2224/32145* (2013.01); *H01L 2224/32225* (2013.01);
(Continued)

(58) Field of Classification Search
CPC ...... H01L 21/56; H01L 21/561; H01L 21/568
See application file for complete search history.

(56) References Cited

U.S. PATENT DOCUMENTS 7,564,115 B2 7/2009 Chen et al.
7,633,165 B2 12/2009 Hsu et al.
(Continued)

FOREIGN PATENT DOCUMENTS

JP 2013197136 * 9/2013

*Primary Examiner* — Trang Q Tran
(74) *Attorney, Agent, or Firm* — Slater Matsil, LLP

(57) ABSTRACT

Packaged semiconductor devices and methods of packaging semiconductor devices are disclosed. In some embodiments, a packaged semiconductor device includes an integrated circuit die and a first interconnect structure coupled to the integrated circuit die. Through-vias are also coupled to the first interconnect structure. A molding material is disposed around the integrated circuit die and the through-vias over the first interconnect structure. The molding material has a pit disposed therein. A recovery material is disposed within the pit in the molding material. A second interconnect structure is disposed over the molding material, the recovery material, the integrated circuit die, and the through-vias.

20 Claims, 15 Drawing Sheets

Related U.S. Application Data division of application No. 14/685,149, filed on Apr. 13, 2015, now Pat. No. 9,786,519.

(51) Int. Cl.
  H01L 23/00 (2006.01)
  H01L 25/00 (2006.01)
  H01L 23/498 (2006.01)
  H01L 23/31 (2006.01)
  H01L 23/538 (2006.01)
  H01L 25/065 (2006.01)

(52) U.S. Cl.
  CPC ............... *H01L 2224/48091* (2013.01); *H01L 2224/48227* (2013.01); *H01L 2224/73265* (2013.01); *H01L 2224/73267* (2013.01); *H01L 2224/83005* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01); *H01L 2924/181* (2013.01); *H01L 2924/1815* (2013.01)

(56) References Cited

U.S. PATENT DOCUMENTS

| | | | |
|---|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,361,842 B2 | 1/2013 | Yu et al. |
| 8,426,961 B2 | 4/2013 | Shih et al. |
| 8,669,174 B2 | 3/2014 | Wu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,802,504 B1 | 8/2014 | Hou et al. |
| 8,803,292 B2 | 8/2014 | Chen et al. |
| 8,803,306 B1 | 8/2014 | Yu et al. |
| 8,803,316 B2 | 8/2014 | Lin et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,318,404 B2 * | 4/2016 | Lin | H01L 24/96 |
| 2005/0194674 A1 | 9/2005 | Thomas et al. |
| 2011/0291288 A1 | 12/2011 | Wu et al. |
| 2013/0026468 A1 | 1/2013 | Yoshimuta et al. |
| 2013/0049182 A1 | 2/2013 | Gong et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0001645 A1 | 1/2014 | Lin et al. |
| 2014/0203429 A1 | 7/2014 | Yu et al. |
| 2014/0217597 A1 | 8/2014 | Lin et al. |
| 2014/0225222 A1 | 8/2014 | Yu et al. |
| 2014/0225258 A1 | 8/2014 | Chiu et al. |
| 2014/0252572 A1 | 9/2014 | Hou et al. |
| 2014/0252646 A1 | 9/2014 | Hung et al. |
| 2014/0264839 A1 | 9/2014 | Tsai et al. |
| 2014/0264930 A1 | 9/2014 | Yu et al. |
| 2014/0374899 A1 * | 12/2014 | Yang | H01L 24/13 257/737 |
| 2015/0137351 A1 * | 5/2015 | Cheng | H01L 23/482 257/737 |
| 2015/0162220 A1 | 6/2015 | Chou et al. |
| 2015/0187710 A1 * | 7/2015 | Scanlan | H01L 24/92 257/777 |
| 2015/0348928 A1 | 12/2015 | Co et al. |
| 2016/0300789 A1 | 10/2016 | Chen |
| 2018/0033650 A1 | 2/2018 | Chen |

\* cited by examiner

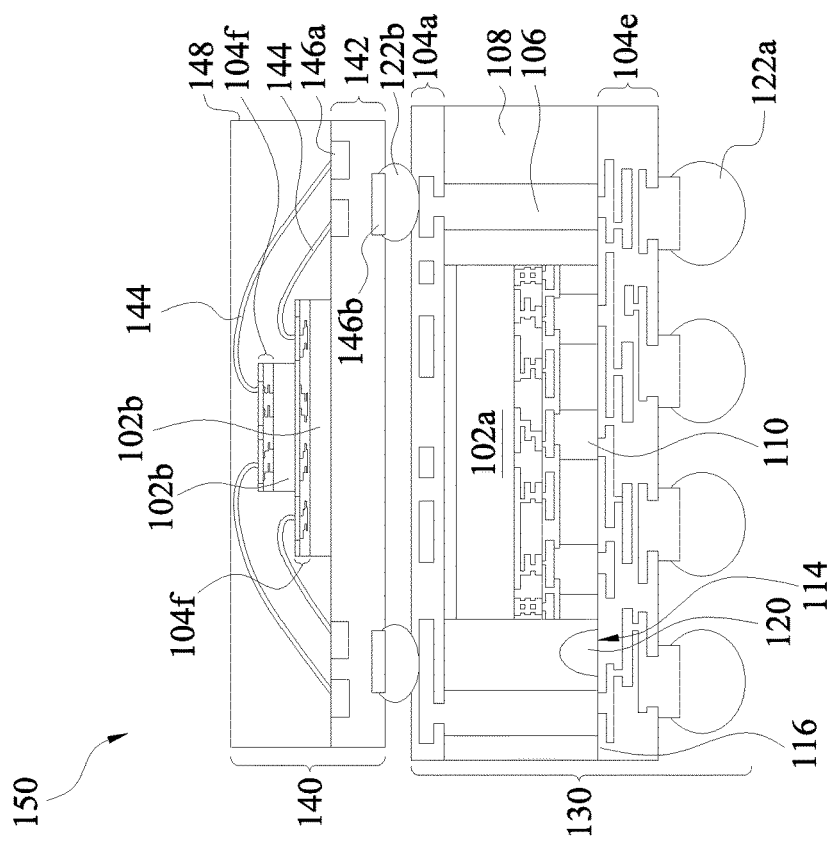
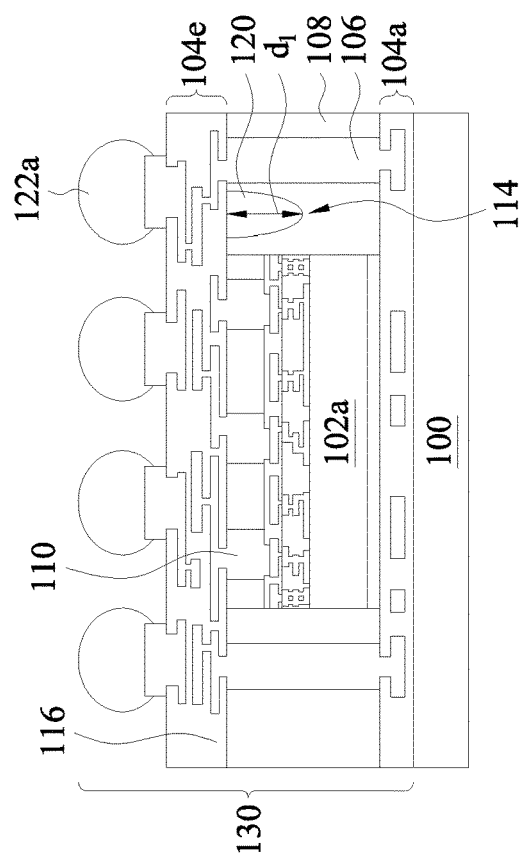
Fig. 5
Fig. 4

PACKAGED SEMICONDUCTOR DEVICES AND METHODS OF PACKAGING SEMICONDUCTOR DEVICES

PRIORITY CLAIM AND CROSS-REFERENCE

This application is a continuation of U.S. application Ser. No. 15/727,339, filed Oct. 6, 2017, entitled "Packaged Semiconductor Devices and Methods of Packaging Semiconductor Devices," which is a divisional of U.S. application Ser. No. 14/685,149, filed Apr. 13, 2015, entitled "Packaged Semiconductor Devices and Methods of Packaging Semiconductor Devices," now U.S. Pat. No. 9,786,519, issued Oct. 10, 2017, which applications are hereby incorporated by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., 3D integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIG. 5 show cross-sectional views of a method of packaging semiconductor devices at various stages in accordance with some embodiments of the present disclosure.

DETAILED DESCRIPTION

Figure 1:
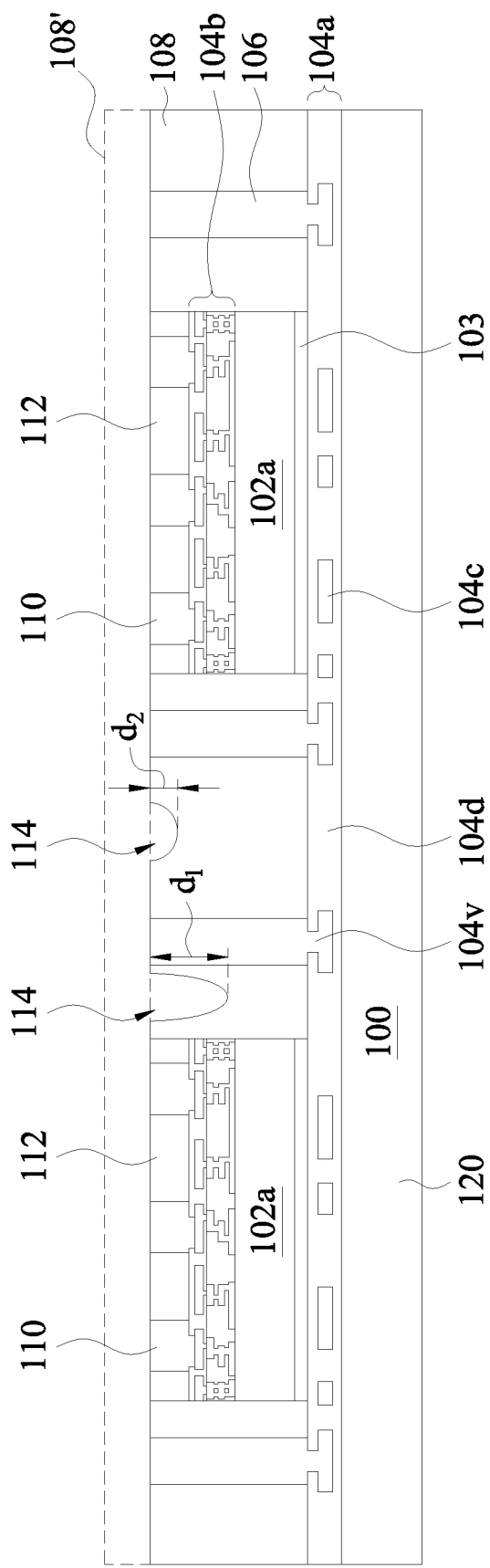

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packaged semiconductor devices and methods of packaging semiconductor devices are disclosed in the present disclosure. Pits in a molding material from chemical-mechanical polishing (CMP) processes, grinding processes, and/or etch processes are filled with a recovery material. The recovery material may be formed just within the pits, or the recovery material may also be formed over integrated circuit dies, through-vias, and a top surface of the molding material of the packaged semiconductor devices. Two layers of the recovery material may also be used to fill the pits in the molding material. In some embodiments, POP devices are formed, wherein two packaged semiconductor devices are coupled together. One of the packaged semiconductor devices includes the recovery material. In some embodiments, one of the semiconductor devices comprises a fan-out structure and the other semiconductor device comprises a packaged dynamic random access memory (DRAM) device, to be described further herein.

FIG. 1 through FIG. 5 show cross-sectional views of a method of packaging semiconductor devices at various stages in accordance with some embodiments of the present disclosure. Referring first to FIG. 1, a packaged semiconductor device at an intermediate stage of a packaging process is shown. A carrier 100 includes an interconnect structure 104a that has been formed on a surface thereof. The carrier 100 comprises a wafer or other type of substrate that is used for the packaging process as a platform for packaging a plurality of integrated circuit dies 102a. The carrier 100 is later removed after packaging the plurality of integrated circuit dies 102a.

The interconnect structure 104a is also referred to herein as a first interconnect structure 104a. The interconnect structure 104a comprises a plurality of dielectric layers 104d having a plurality of conductive features such as conductive lines 104c and conductive vias 104v formed therein and/or contact pads (not shown) formed thereon. Only one conductive line 104c layer, one conductive via 104v layer, and three dielectric layers 104d are shown in the interconnect structure 104a illustrated in FIG. 1; however, the interconnect structure 104a may comprise one or more conductive line 104c layers, one or more conductive via 104v layers, and one or more dielectric layers 104d in some embodiments. The interconnect structure 104a comprises a redistribution layer (RDL) that provides electrical connections in a horizontal direction for the packaged semiconductor devices in some embodiments, for example. The interconnect structure 104a may also comprise other types of interconnect structures, such as a post passivation interconnect (PPI) structure, as an example. The dielectric layers 104d may comprise polybenzoxazole (PBO); silicon dioxide; low dielectric constant (k) materials having a k value less than a k value of silicon dioxide, which is about 3.9; passivation materials; other insulating materials; or multiple layers or combinations thereof, as examples. The conductive lines 104c, conductive vias 104v, and contact pads of the interconnect structure 104a may comprise copper, copper alloys, or other materials, as examples. Portions of the interconnect structure 104a may comprise conductive features that comprise an under-ball metallization (UBM) structure (not shown) or other types of structures, as another example. The interconnect structure 104a may also comprise other types of features and other materials.

FIG. 1 also illustrates a plurality of through-vias 106 that has been formed on the first interconnect structure 104a. The plurality of through-vias 106 may be formed over the first interconnect structure 104a by plating, photolithography, or other methods, before or after a plurality of integrated circuit dies 102a is coupled to the first interconnect structure 104a. In some embodiments, first, the plurality of through-vias 106 is plated over the first interconnect structure 104a, and second, the plurality of integrated circuit dies 102a is attached to the first interconnect structure 104a, for example. The plurality of through-vias 106 may be formed using an electro-plating process, by depositing a seed layer (not shown) over the interconnect structure 104a, and forming a patterned mask (also not shown) with a desired pattern for the through-vias 106 over the seed layer. The through-vias 106 are plated onto the interconnect structure 104a through the patterned mask, and the patterned mask is then removed. The exposed portions of the seed layer are also removed. The through-vias 106 may comprise copper, a copper alloy, or other metals or conductive materials. Dozens or hundreds of through-vias 106 may be included in a package for each of the integrated circuit dies 102a or groups of integrated circuit dies 102a that are packaged together, for example. The plurality of through-vias 106 provides electric connections in a vertical direction for the packaged semiconductor devices in some embodiments. Each of the plurality of through-vias 106 may be coupled to a conductive via 104v, contact pad, or conductive line 104c of the first interconnect structure 104a, for example.

A plurality of integrated circuit dies 102a has also been coupled to the first interconnect structure 104a between some of the plurality of through-vias 106, which is also illustrated in FIG. 1. The plurality of integrated circuit dies 102a is coupled to the interconnect structure 104a using a die attach film (DAF) 103 disposed on a bottom surface of the integrated circuit dies 102a. The plurality of integrated circuit dies 102a each includes a second interconnect structure 104b formed thereon, and contacts 110 disposed on a top surface thereof which are formed in an insulating material 112. In some embodiments, the contacts 110 comprise copper vias and the insulating material 112 comprises PBO, as examples. The contacts 110 and insulating material 112 may also comprise other materials. The plurality of integrated circuit dies 102a may comprise logic devices, processors, or other devices, as examples. The integrated circuit dies 102a are formed on a wafer (not shown), and the integrated circuit dies 102a are singulated along scribe lines to form the plurality of integrated circuit dies 102a in some embodiments. The plurality of integrated circuit dies 102a may be placed on the first interconnect structure 104a using a pick-and-place machine or manually, for example.

Also illustrated in FIG. 1, a molding material 108 has been disposed over the first interconnect structure 104a, the plurality of integrated circuit dies 102a, and the plurality of through-vias 106. The molding material 108 is disposed between the through-vias 106 and integrated circuit dies 102a, between adjacent ones of the plurality of through vias 106, and/or between adjacent ones of the plurality of integrated circuit dies 102a, in some embodiments wherein two or more integrated circuit dies 102a are packaged together. The molding material 108 comprises a molding compound comprised of an insulating material, such as an epoxy, a filler material, a stress release agent (SRA), an adhesion promoter, other materials, or combinations thereof, as examples. The molding material 108 comprises a liquid or gel when applied so that it flows between and around the plurality of through-vias 106 and integrated circuit dies 102a, in some embodiments. The molding material 108 is then cured or allowed to dry so that it forms a solid. In some embodiments, as deposited, the molding material 108 extends over top surfaces of the plurality of integrated circuit dies 102a and the plurality of through-vias 106, as shown in phantom (e.g., in dashed lines) in FIG. 1 at 108'.

In accordance with some embodiments, after the molding material 108 is applied, a top portion of the molding material 108 is removed, as shown in FIG. 1. The top portion of the molding material 108 is removed using a planarization process, such as a CMP process, a grinding process, an etch process, or combinations thereof, as examples. Other methods may also be used to planarize the molding material 108. A top portion of the integrated circuit dies 102a and/or through-vias 106 may also be removed during the planarization process for the molding material 108.

In some embodiments, pits 114 are formed in the top surface of the molding material 108 during the planarization process. Only one or two pits 114 are shown in the drawings of the present disclosure; however, fewer or more pits 114 may be formed in accordance with some embodiments across the surface of the molding material 108. The pits 114 may range in size from a depth of about 3 μm to about 50 μm, and a width in a top view of about 6.5 μm to about 200 μm, as examples. Some pits 114 may be relatively large and may comprise a depth within the surface of the molding material 108 comprising dimension $d_1$, wherein dimension $d_1$ comprises about 10 μm to about 50 μm, for example. Other pits 114 may be smaller and may comprise a depth comprising dimension $d_2$, wherein dimension $d_2$ comprises about 3 μm to about 10 μm, for example. Other pits 114 may comprise a depth comprising dimension $d_3$ (not shown in FIG. 1; see FIG. 8), wherein dimension $d_3$ comprises greater than about 50 μm, as another example. In other embodiments, the pits 114 comprise a depth of about 3 μm or greater, for example. The pits 114 may comprise a dimension that is large enough such that a packaging device would benefit from filling the pits 114 to improve planarity of the molding material 108 in some embodiments, for example. The pits 114 may also comprise other dimensions.

Figure 2:
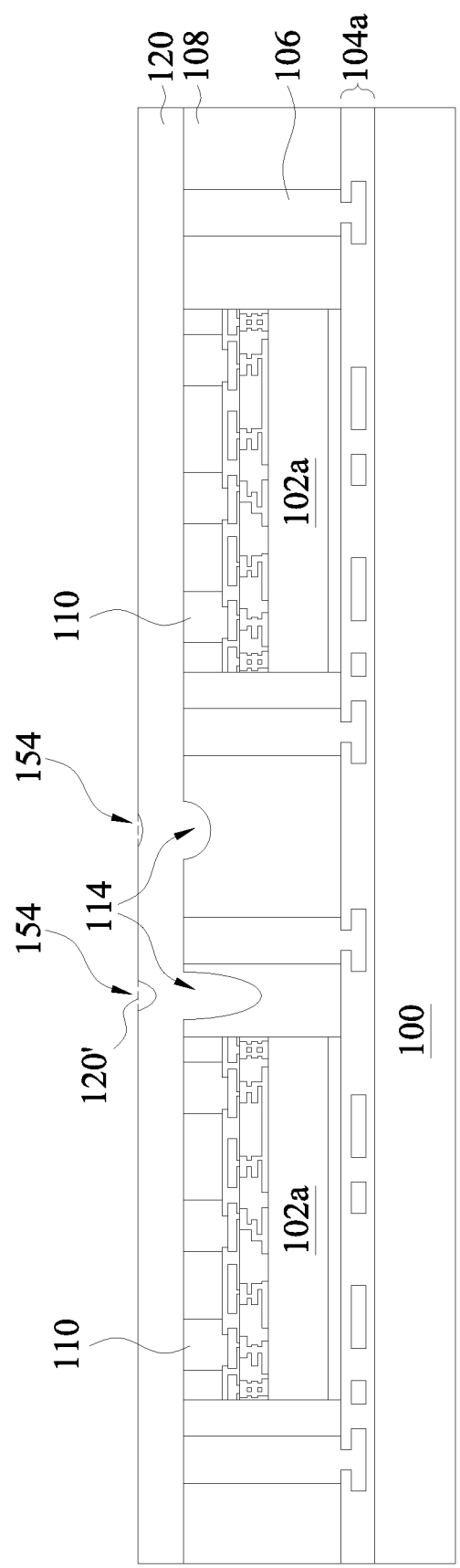

In accordance with some embodiments, the pits 114 are filled with a recovery material 120, as shown in FIG. 2. In some embodiments, the recovery material 120 comprises a polymer coating that is formed over the molding material 108, filling the pits 114. The recovery material 120 is also formed over the top surfaces of the integrated circuit dies 102a and the through-vias 106. The recovery material 120 comprises PBO, polyimide (PI), other polymer materials, or combinations or multiple layers thereof in some embodiments. The recovery material 120 is formed using a spin-on process in some embodiments. The recovery material 120 is substantially conformal to a topography of the underlying materials in some embodiments. For example, the recovery material 120 may comprise divots 154 disposed over the pits 114 after the deposition process of the recovery material 120. The recovery material 120 may also be substantially planar, as illustrated in phantom at 120' in FIG. 2. The recovery material 120 may not have divots 154 formed therein after the deposition process of the recovery materials 120 in other embodiments, for example.

The recovery material 120 comprises a thickness of about 5 μm to about 50 μm, or about 20 μm to about 40 μm in some embodiments, for example. In other embodiments, the recovery material 120 comprises a thickness of about 5 μm or greater, as another example. The recovery material 120 comprises a thickness about equal to the depth of the pit(s) in some embodiments. The recovery material 120 comprises a thickness that is sufficient to fill the pit(s), for example. In other embodiments, the recovery material 120 comprises a thickness that is less than the depth of the pit(s). The recovery material 120 comprises a thickness that is not sufficient to fill the pit(s) in some embodiments, to be described further herein with reference to FIGS. 8 through 12. In other embodiments, the recovery material 120 comprises a thickness that is greater than the depth of the pit(s), as illustrated in FIG. 2. The recovery material 120 comprises a thickness sufficient to partially or fully fill the pit(s) in some embodiments, for example. The recovery material 120 may comprise the same or different materials as a material used for a subsequently formed dielectric layer of an interconnect structure (see dielectric layer 116 of interconnect structure 104e in FIG. 4). The recovery material 120 may also comprise other materials, dimensions, and formation methods.

Figure 3:
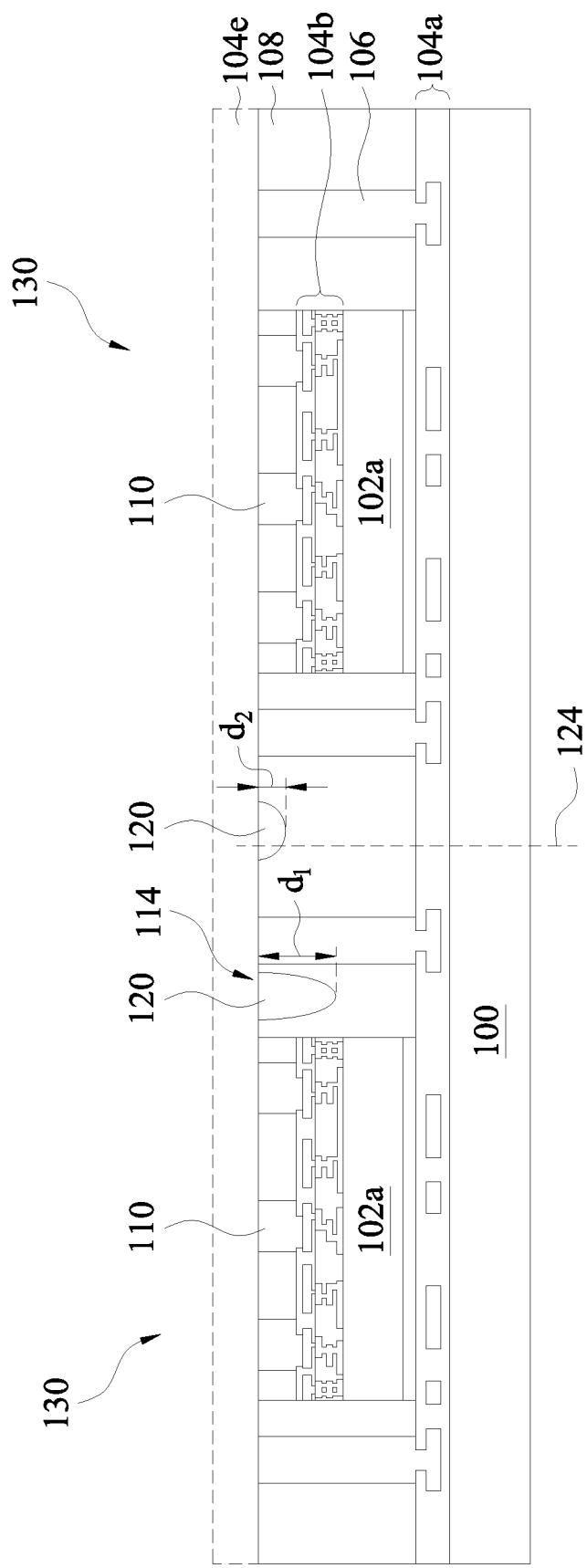

Another planarization process is used to remove the recovery material 120 from the top surfaces of the molding material 108, the integrated circuit dies 102a, and the through-vias 106 in some embodiments, as shown in FIG. 3. The planarization process may comprise a CMP process, a grinding process, an etch process, or combinations thereof, as examples. Other methods may also be used to planarize the recovery material 120. The planarization process may be adapted to stop on top surfaces of the molding material 108, the through-vias 106, and/or the integrated circuit dies 102a, for example. A portion of the recovery material 120 is left remaining within the pit 114 after the planarization process. The recovery material 120 substantially fills the pit 114 in the embodiments shown in FIG. 3. Including the recovery material 120 in the packaged semiconductor device advantageously improves the planarity of the top surface of the molding material 108, through-vias 106, and integrated circuit dies 102a. A top surface of the recovery material 120 is substantially co-planar with the top surfaces of the molding material 108, the plurality of through-vias 106, and the integrated circuit die 102a after the planarization process for the recovery material 120 in some embodiments, as illustrated in FIG. 3.

A third interconnect structure 104e is then formed, as illustrated in phantom in FIG. 3 and in FIG. 4. The third interconnect structure 104e comprises an RDL, PPI structure, or other type of interconnect structure that is formed over the molding material 108, the plurality of through-vias 106, and the plurality of first integrated circuit dies 102a. The third interconnect structure 104e comprises similar material layers, materials, and features as described for the first interconnect structure 104a for example, such as dielectric layers 104d, conductive line layers 104c, conductive via layers 104v, and contact pads (not labelled in the second interconnect structure 104e). The third interconnect structure 104e may also comprise the same or different material layers, materials, and features as described for the first interconnect structure 104a. The third interconnect structure 104e provides electrical connections in a horizontal direction for a plurality of packaged semiconductor devices 130 in some embodiments, for example. The third interconnect structure 104e comprises front-side routing, and the first interconnect structure 104a comprises back-side routing, e.g., relative to the integrated circuit die 102a, for the packaged semiconductor devices 130 in some embodiments.

The third interconnect structure 104e is improved by the inclusion of the recovery material 120 in the packaged semiconductor device 130. Shorts or breaks in the wiring of the third interconnect structure 104e are avoided or reduced in some embodiments, due to the improved planarity of the top surface of the molding material 108 provided by the recovery material 120 within the pits 114, for example. Furthermore, the recovery material 120 disposed within the pits 114 prevents a first dielectric layer 116 of the third interconnect structure 104e, shown in FIG. 4, from being formed within the pits 114. The first dielectric layer 116 may comprise PBO or other insulating materials, for example. In some embodiments, the dielectric layer 116 of the second interconnect structure 104e is not disposed in the pit 114 in the molding material 108, for example. Rather, the recovery material 120 fills the pit 114, advantageously preventing the dielectric layer 116 from forming in the pit.

Only two packaged semiconductor devices 130 are shown disposed over the carrier 100 in FIGS. 1 through 3; however, dozens, hundreds, or more packaged semiconductor devices 130 may be simultaneously formed over the carrier 100 in an array of rows and columns. Each of the packaged semiconductor devices 130 comprises an integrated circuit die 102a or a plurality of integrated circuit dies 102a. For example, two or more integrated circuit dies 102a may be packaged together in a single packaged semiconductor device 130.

In some embodiments, the plurality of packaged semiconductor devices 130 is singulated along scribe lines 124, as shown in FIGS. 3 and 4, to form a plurality of separated packaged semiconductor devices 130. The packaged semiconductor devices 130 may be singulated using a saw (not shown in FIGS. 3 and 4; see saw 164 in FIG. 17), which may include a blade comprising diamond or other materials in some embodiments, for example. A plurality of connectors 122a may be coupled to portions of the second interconnect structure 104e in some embodiments, as shown in FIG. 4. The connectors 122a may be coupled to contact pads (not labeled) and/or UBM structures of the second interconnect structure 104e, for example. A plurality of connectors may also be coupled to contact pads and/or UBM structures of the first interconnect structure 104a (not shown in FIG. 4; see connectors 122b in FIG. 5). The plurality of connectors 122a and/or 122b may be arranged in a ball grid array (BGA) in some embodiments. In some embodiments, a material of the plurality of connectors 122a and 122b comprises a eutectic material such as solder that is adapted to melt at a predetermined temperature, for example. The connectors 122a and 122b may comprise solder balls or solder bumps in some embodiments, as examples. The plurality of connectors 122a may also comprise other types of connection devices, such as conductive bumps, conductive balls, conductive pillars, non-spherical connectors, or other connectors. When the eutectic material of the connectors 122a and 122b cools, the plurality of connectors 122a and 122b may be used to electrically and mechanically couple the plurality of packaged semiconductor devices 130 to another device or object. The carrier 100 is then removed, leaving a plurality of separated packaged semiconductor devices 130, in some embodiments. The carrier 100 is removed from the first interconnect structure 104a of the packaged semiconductor device 100, for example. In some embodiments, the plurality of connectors 122a is not included on the packaged semiconductor device 130.

The packaged semiconductor devices 130 comprise fan-out structures in some embodiments. For example, the conductive wiring is spaced out farther in the first and third interconnect structures 104a and 104e than conductive wiring is spaced in the interconnect structure 104b of the integrated circuit die 102a. Likewise, the footprint of contact pads in or on the first and third interconnect structures 104a and 104e is larger than the footprint of contacts 110 of the integrated circuit die 102a. The recovery material 120 improves the planarity of the surface that the third interconnect structure 104e that includes a fan-out structure is formed on, in some embodiments.

The packaging process flow for packaging integrated circuit dies 102a and forming packaged semiconductor devices 130 may also comprise other processing steps and orders of the processing steps.

In other embodiments, the packaged semiconductor devices 130 comprise first packaged semiconductor devices 130 that are packaged with second packaged semiconductor devices 140 to form POP devices 150, as shown in FIG. 5. The second packaged semiconductor devices 140 are also referred to herein as packaged integrated circuits (ICs) or packaged semiconductor device 140. Before the packaged semiconductor devices 130 are singulated, and after the carrier 100 is removed, a plurality of the second packaged semiconductor devices 140 is provided, and each of the plurality of second packaged semiconductor devices 140 is coupled to one of the first packaged semiconductor devices 130 using a plurality of connectors 122b coupled to the first interconnect structure 104a of the first packaged semiconductor devices 130, coupled to the second packaged semiconductor devices 140, or coupled to both the first packaged semiconductor devices 130 and the second packaged semiconductor devices 140.

The plurality of second packaged semiconductor devices 140 may include one or more integrated circuit dies 102b that have been encapsulated with protective materials, and electrical wiring structures may be coupled to the integrated circuit dies 102b, to be described further herein.

In some embodiments, a plurality of the second packaged semiconductor devices 140 is provided, and the plurality of second packaged semiconductor devices 140 is coupled to the unsingulated plurality of first packaged semiconductor devices 130 by a method such as manually by an operator or technician, the use of an automated machine such as a pick-and-place machine, or other methods. The plurality of first packaged semiconductor devices 130 is then singulated to form the POP devices 150.

Each of the plurality of second packaged semiconductor devices 140 may comprise a substrate 142 that includes a plurality of contact pads 146a and 146b disposed on. The substrate 142 may include one or more interconnect structures (not shown) formed thereon that provide horizontal connections for the plurality of second packaged semiconductor devices 140 in some embodiments. The substrate 142 may also include a plurality of through-vias (also not shown) formed therein. One or more integrated circuit dies 102b may be coupled to a top surface of the substrate 142. Each of the plurality of second packaged semiconductor devices 140 comprises two vertically stacked integrated circuit dies 102b in the embodiments shown in FIG. 5, for example. Two or more integrated circuit dies 102b may also be packaged together horizontally in the second packaged semiconductor devices 140 in some embodiments, not shown.

In the embodiments shown, the integrated circuit dies 102b are coupled to contact pads 146a disposed on a top surface of the substrate 142 by bond wires 144. The bond wires 144 and through-vias in the substrate 142 provide vertical electrical connections for the plurality of second packaged semiconductor devices 140 in some embodiments. A molding material 148 is disposed over the integrated circuit dies 102b, the bond wires 144, and the substrate 142. The molding material 148 may comprise similar materials as described for the molding material 108 of the plurality of first packaged semiconductor devices 130, for example. The molding material 108 of the plurality of first packaged semiconductor devices 130 is also referred to herein as a first molding material 108, and the molding material 148 of the plurality of second packaged semiconductor devices 140 is also referred to herein as a second molding material 148.

In some embodiments, the integrated circuit die or dies 102b comprise DRAM devices, for example. The integrated circuit dies 102b may also comprise other types of devices. One or more integrated circuit dies 102b may be included in the second packaged semiconductor devices 140. The integrated circuit dies 102b may be packaged together vertically as shown, or horizontally. The integrated circuit dies 102b may be packaged in a wire bond type of package as shown in FIG. 5, or the integrated circuit dies 102b may be packaged in other types of packages and using other types of packaging techniques.

A plurality of connectors 122b, such as a eutectic material, is coupled to the bottom surface of the substrates 142 of the second packaged semiconductor devices 140 in some embodiments. The plurality of connectors 122b may be coupled to contact pads 146b disposed on a bottom surface of the substrate 142, for example. In some embodiments, the plurality of second packaged semiconductor devices 140 does not include the plurality of connectors 122b, e.g., in embodiments wherein the plurality of first packaged semiconductor devices 130 includes the plurality of connectors 122b disposed on the top surface thereof. In other embodiments, a plurality of connectors 122b are included on both the first packaged semiconductor devices 130 and the second packaged semiconductor devices 140.

After the second packaged semiconductor devices 140 are coupled to the first packaged semiconductor devices 130 using the plurality of connectors 122b, as shown in FIG. 5, a eutectic material of the connectors 122b is then reflowed, which mechanically and electrically couples the second packaged semiconductor devices 140 to the first packaged semiconductor devices 130. Each of the plurality of second packaged semiconductor devices 140 is coupled to one of the plurality of first packaged semiconductor devices 130 using some of the plurality of connectors 122b, for example. The plurality of first packaged semiconductor devices 130 and the plurality of second packaged semiconductor devices 140 are arranged in an array of rows and columns in some embodiments. A plurality of scribe lines is disposed in an x direction and y direction between the plurality of first packaged semiconductor devices 130 and the plurality of second packaged semiconductor devices 140. The POP devices 150 are then singulated along the scribe lines. The POP devices 150 may then be coupled to another device or object using the plurality of connectors 122a disposed on the bottom surfaces of the POP devices 150, e.g., using a surface mount technology (SMT) process.

Note that all of the elements of the plurality of first packaged semiconductor devices and the plurality of second packaged semiconductor devices 140 are not labeled in FIGS. 2 through 4 and some of the subsequent figures of the present disclosure, in order to simplify the drawings. FIGS. 1 and 5 may be referred to again for more detailed element numbers.

Figure 6B:
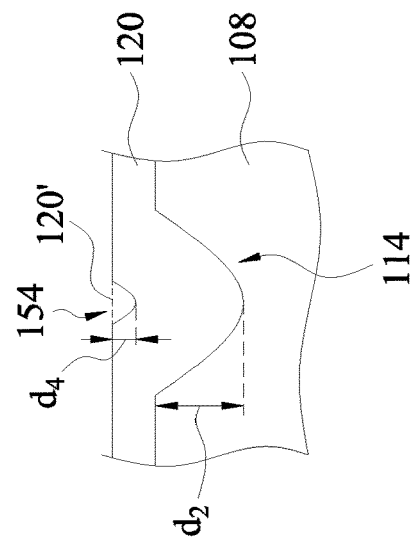
FIG. 6B is a more detailed view of a portion of FIG. 6A in accordance with some embodiments.
Figure 6A:
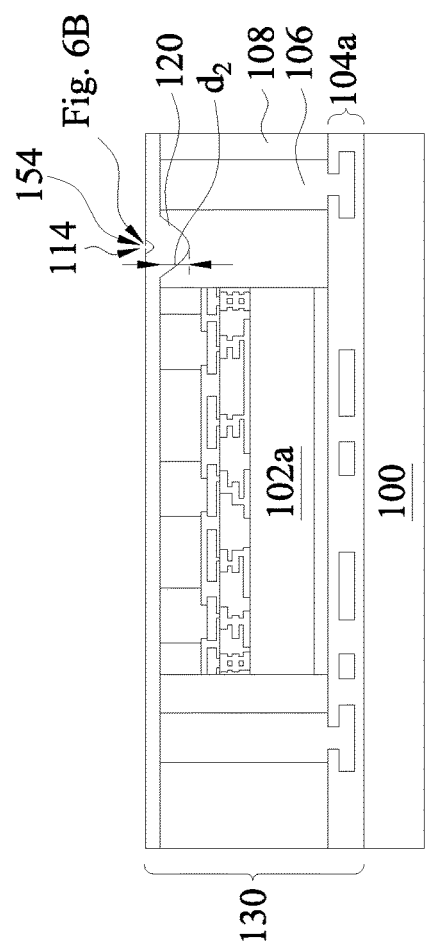
FIGS. 6A and FIG. 7 illustrate cross-sectional views of a method of packaging semiconductor devices at various stages in accordance with some embodiments.
Figure 7:
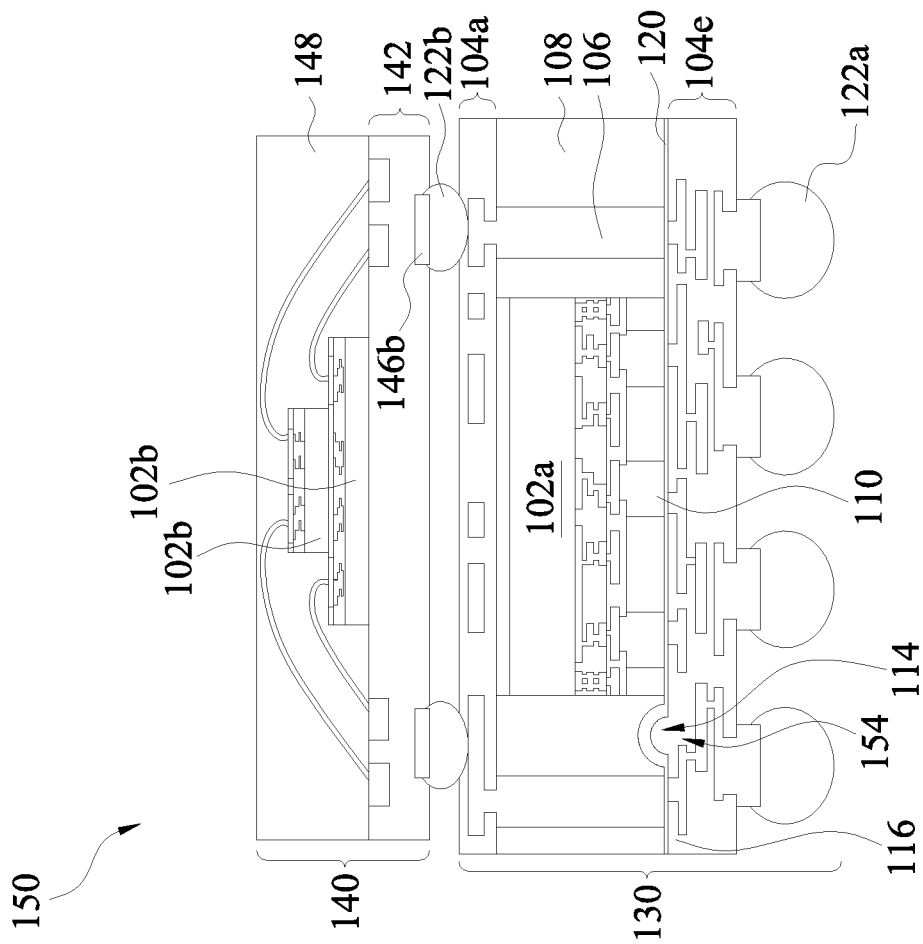

FIGS. 6A and FIG. 7 illustrate cross-sectional views of a method of packaging semiconductor devices at various stages in accordance with some embodiments. FIG. 6B is a more detailed view of a portion of FIG. 6A in accordance with some embodiments. After the packaging processing steps described for FIG. 1, the molding material 108 top surface has one or more pits 114 formed therein that has a depth comprising dimension $d_2$. In the embodiments shown, the recovery material 120 is deposited over the top surfaces of the molding material 108, the integrated circuit dies 102a, and the plurality of through-vias 106. The recovery material 120 is relatively thin, comprising a thickness of about the same depth of the pit 114. In some embodiments, the recovery material 120 comprises a thickness of about 5 μm to about 50 μm, or about 20 μm to about 40 μm, as examples. The recovery material 120 may comprise a thickness of about 5 μm or greater, as another example. The recovery material 120 is left remaining on the packaged semiconductor device 130 over the top surfaces of the molding material 108, the integrated circuit dies 102a, and the plurality of through-vias 106 in some embodiments, as shown in FIG. 7. Thus, a planarization step to remove the recovery material 120 from the top surfaces of the molding material 108, the integrated circuit dies 102a, and the plurality of through-vias 106 is not required. The second interconnect structure 104e is formed over the recovery material 120, and a plurality of connectors 122a is formed on portions of the second interconnect structure 104e. Openings may be formed in the recovery material 120 to make electrical connections between the through-vias 106 or contacts 110 and the second interconnect structure 104e using a lithography process, for example. The carrier 100 is removed, and the first packaged semiconductor device 130 is inverted and coupled to another packaged semiconductor device, such as second packaged semiconductor device 140 shown in FIG. 7, forming a POP device 150.

In some embodiments, the recovery material 120 is substantially conformal to a topography of the underlying materials such as the molding material 108, and the recovery material 120 includes divots 154 formed over the pits 114 in the molding material 108 after the deposition process of the recovery material 120, as illustrated in FIG. 6A and as shown in a more detailed view in FIG. 6B. The divots 154 comprise a depth comprising dimension $d_4$, wherein dimension $d_4$ is less than the depth comprising dimension $d_2$ of the pits 114 in some embodiments. Dimension $d_2$ is also referred to herein as a first depth, and dimension $d_4$ is also referred to herein as a second depth, wherein the second depth is less than the first depth. Thus, the recovery material 120 improves the planarity of the top surface of the package prior to the interconnect structure 104e (see FIG. 7) formation in some embodiments, for example.

The recovery material 120 may also be substantially planar after the deposition process for the recovery material 120 in other embodiments, as illustrated in phantom at 120' in FIG. 6B. The recovery material 120 may not have divots 154 formed therein after the deposition process of the recovery materials 120 in other embodiments, for example. Thus, including the recovery material 120 in the packaged semiconductor device 130 results in a substantially planar surface (i.e., the planar top surface of the recovery material 120) for formation of the interconnect structure 104e, in some embodiments.

Thus, in some embodiments, the recovery material 120 is left remaining over top surfaces of the molding material 108, the integrated circuit dies 102a, and the plurality of through-vias 106 in a packaged semiconductor device 130 or a POP device 150, and a need for an additional planarization step is avoided. The recovery material 120 is disposed within a pit 114 in the molding material 108. The recovery material 120 is further disposed over portions of the integrated circuit die 102a, the plurality of through-vias 106, and a surface of the molding material 108, as illustrated in FIGS. 6A, 6B, and 7. The recovery material 120 residing in the pit 114 advantageously prevents a first dielectric layer 116 of an interconnect structure 104e from being formed within the pit 114 in the molding material 108 in some embodiments.

In some of the embodiments shown in FIGS. 6A, 6B, and 7, a divot may be formed in the recovery material 120 over the pit 114. The divot may comprise a depth that is less than the depth comprising dimension $d_2$ in some embodiments. Thus, the recovery material 120 improves the planarity of the top surface of the packaged semiconductor device 130, which facilitates in the subsequent formation of high reliability and high yield interconnect structure 104e. In some of the other embodiments shown in FIGS. 6A, 6B, and 7, a divot is not formed in the recovery material 120 over the pit 114, and the recovery material 120 as-deposited comprises a substantially flat, planar surface (not shown). Thus, the recovery material 120 improves the planarity of the top surface of the packaged semiconductor device 130, and prevents a first dielectric layer 116 of the interconnect structure 104e from being formed in the pit 114.

Figure 8:
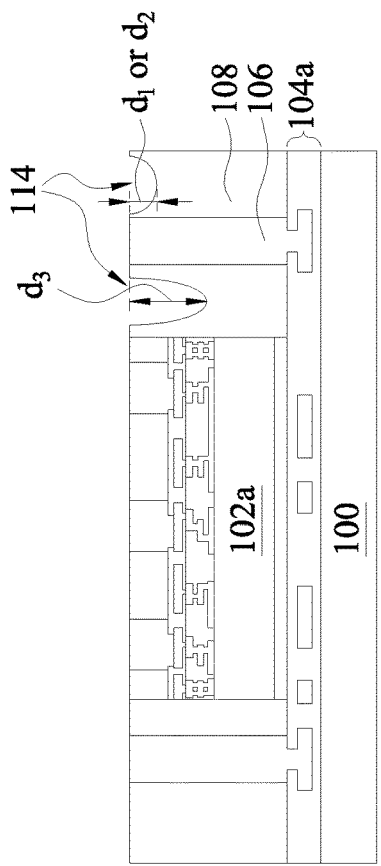

FIG. 8 through FIG. 12 illustrate cross-sectional views of a method of packaging semiconductor devices at various stages in accordance with some embodiments. For some embodiments wherein some of the pits 114 in the molding material 108 comprise a depth of dimension $d_3$ comprising greater than about 50 µm, an additional layer of the recovery material 120b may be included over the molding material 108. FIG. 8 illustrates a packaged semiconductor device wherein after the molding material 108 is planarized, pits 114 having a depth comprising dimension $d_1$ or $d_2$ and dimension $d_3$ are left remaining in the top surface of the molding material 108. The packaged semiconductor device may include a plurality of first pits 114 having a first depth comprising dimension $d_3$ and a plurality of second pits 114 having a second depth comprising dimension $d_1$ or $d_2$, for example. The second depth of the second pits 114 is less than the first depth of the first pits 114.

Figure 9:
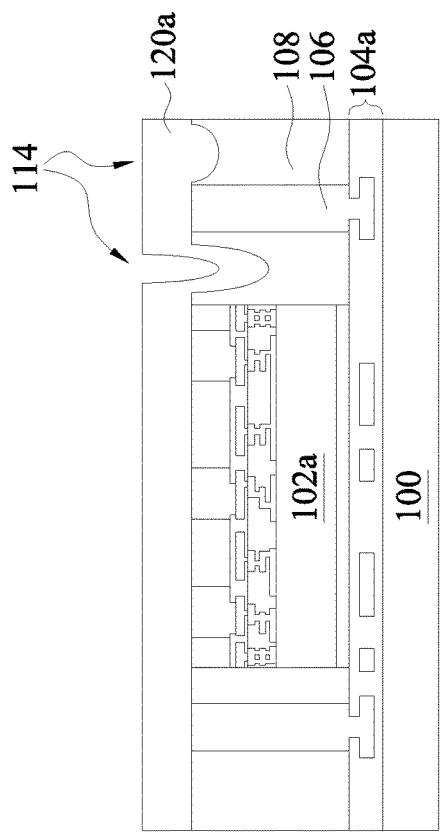
FIG. 8 through FIG. 12 illustrate cross-sectional views of a method of packaging semiconductor devices at various stages in accordance with some embodiments.

In FIG. 9, a first recovery material 120a is formed over the top surfaces of the molding material 108, the integrated circuit dies 102a, and the plurality of through-vias 106. The first recovery material 120a comprises a similar material and dimension as described for recovery material 120 shown in the previous embodiments, for example. In some embodiments, forming the first recovery material 120a comprises forming a material having a thickness of about 3 µm to about 50 µm. The first recovery material 120a comprises a sufficient thickness to partially fill the pits 114 having a depth comprising dimension $d_3$ in some embodiments. The first recovery material 120a comprises a sufficient thickness to substantially fill the pits 114 having a depth comprising dimension $d_1$ or $d_2$, in other embodiments. Forming the first recovery material 120a comprises substantially filling the plurality of second pits 114 having a second depth comprising dimension $d_1$ or $d_2$ in some embodiments, for example.

Figure 10:
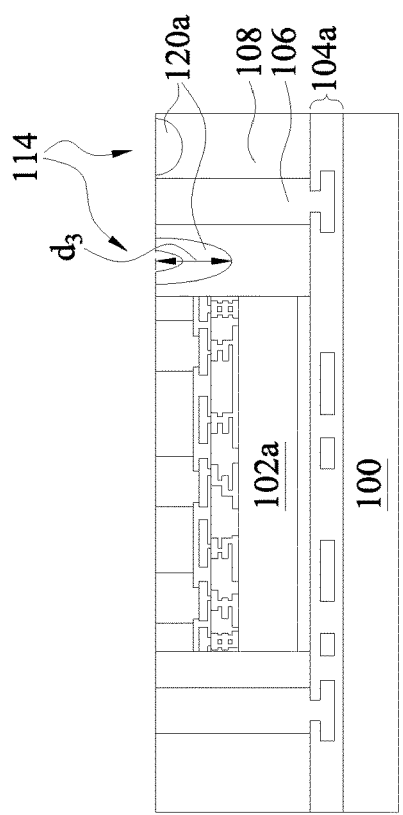

The first recovery material 120a is then planarized using a grinding process, a CMP process, and/or an etch process, as shown in FIG. 10. The planarization process is adapted to stop on the top surface of the molding material 108, the through-vias 106, and/or the integrated circuit dies 102a in some embodiments, for example. Portions of the first recovery material 120a are left remaining within the pits 114 having a depth comprising dimension $d_3$ in a bottom region of the pits 114 having a depth comprising dimension $d_3$ after the planarization process, which is also illustrated in FIG. 10. For pits 114 having a depth of dimension $d_3$, the pits 114 may not completely be filled with the first recovery material 120a. Other pits 114 having a depth comprising dimension $d_1$ or $d_2$ may be substantially filled with the first recovery material 120a.

In some embodiments, a first portion of the first recovery material 120a is removed from over the molding material 108, the through-vias 106, and the integrated circuit die 102a, and removing the first portion of the first recovery material 120a leaves a second portion of the recovery material 120a within the pits 114 in the molding material 108. Removing the first portion of the first recovery material 120a comprises leaving the second portion of the recovery material 120a in a bottom region of the pits 114, in some embodiments, for example.

A thickness of the first recovery material 120a residing in the bottom region of the pits 114 comprising the depth of dimension $d_3$ may comprise about 3 µm to about 50 µm, for example. The thickness of the first recovery material 120a residing in the bottom region of the pits 114 comprising the depth of dimension $d_3$ may also comprise other values.

Figure 11:
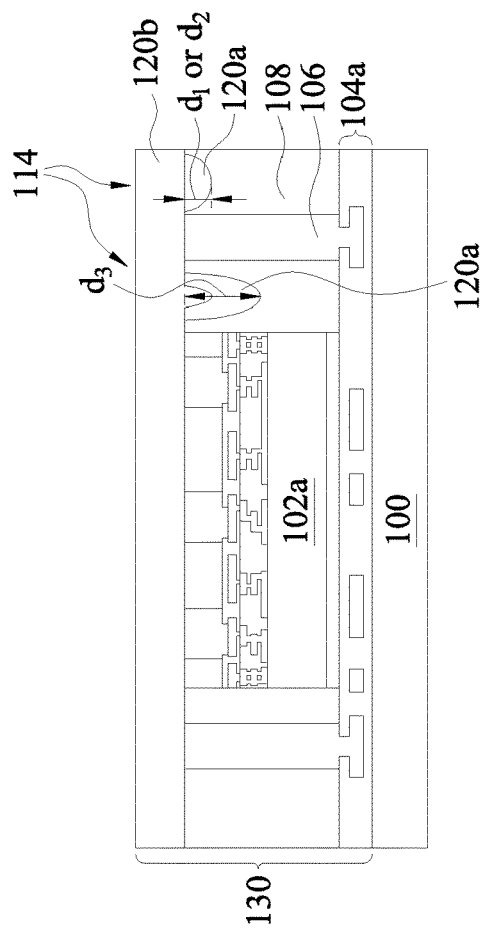

To substantially fill the deeper pits 114 having the depth comprising dimension $d_3$ within the molding material 108, in some embodiments, a second recovery material 120b is formed over the top surfaces of the molding material 108, the integrated circuit dies 102a, the plurality of through-vias 106, the first recovery material 120a disposed within a bottom region of the pits 114 having the depth of dimension $d_3$, and the first recovery material 120a disposed within the pits 114 having the depth comprising dimension $d_1$ or $d_2$, as illustrated in FIG. 11. The second recovery material 120b comprises a similar material and dimension as described for recovery material 120 shown in the previous embodiments, for example. In some embodiments, forming the second recovery material 120b comprises forming a material having a thickness of about 3 µm to about 50 µm, or about 20 µm to about 40 µm. The second recovery material 120b comprises a sufficient thickness to substantially fill the pits 114 having a depth comprising dimension $d_3$ over the first recovery material 120b in bottom region of the pits 114 in some embodiments. The second recovery material 120b may also comprise other materials and dimensions.

Figure 12:
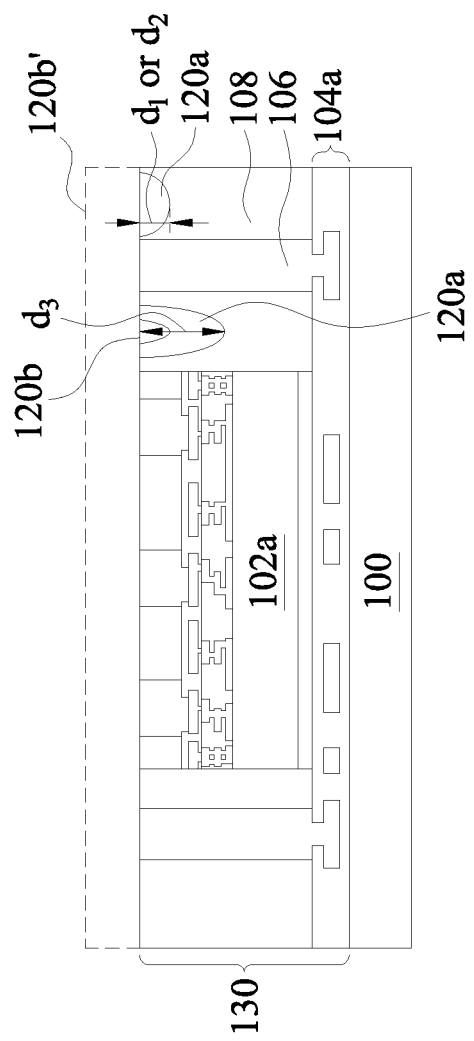

Next, the second recovery material 120b may be planarized using a grinding process, a CMP process, and/or an etch process in accordance with some embodiments, as shown in FIG. 12. The second recovery material 120b before the planarization process is shown in FIG. 11 and in FIG. 12 at 120b' in phantom. The planarization process for the second recovery material 120b is adapted to stop on the top surfaces of the molding material 108, the integrated circuit dies 102a, and/or the plurality of through-vias 106, for example. Portions of the second recovery material 120b are left remaining within the deeper pits 114 having a depth comprising dimension $d_3$ over the first recovery material 120a, also illustrated in FIG. 12. For pits 114 having the depth of dimension $d_3$, the pits 114 may not completely be filled with the first recovery material 120a, and the top regions of the pits 114 disposed over the bottom regions of the pits 114 are substantially filled with the second recovery material 120a, over the first recovery material 120a in the bottom regions of the pits 114, for example. Other pits 114 having the depth comprising dimension $d_1$ or $d_2$ may be substantially filled with the first recovery material 120a, which is also illustrated in FIG. 12, and the second recovery material 120a is not left residing over the pits 114 having the depth comprising dimension $d_1$ or $d_2$, for example.

A thickness of the second recovery material 120a residing in the top region of the pits 114 comprising the depth of dimension $d_3$ may comprise about 3 µm to about 50 µm in some embodiments, for example. The thickness of the second recovery material 120a residing in the top region of the pits 114 comprising the depth of dimension $d_3$ may also comprise other values.

In other embodiments, the second recovery material 120b is not planarized, as shown in FIG. 11. For example, the packaged semiconductor device 130 may include the second recovery material 120b disposed over the top surfaces of the molding material 108, the plurality of through-vias 106, the integrated circuit dies 102a, and the first recovery material 120a. The second recovery material 120b may be substantially planar, as shown in FIG. 11, or the second recovery material 120b may comprise a divot 154 disposed over the larger pits 114 comprising a depth comprising dimension $d_3$, for example, as illustrated in the embodiments shown in FIGS. 6A and 6B.0 The interconnect structure 104e is formed directly over and abutting the second recovery material 120b disposed over the molding material 108, the plurality of through-vias 106, the integrated circuit dies 102a, and the first recovery material 120a.

The packaged semiconductor device 130 may then be completed, such as forming an interconnect structure 104e over the molding material 108 or second recovery material 120b, and forming connectors 122a on the interconnect structure 104e, as shown in and described for FIG. 4. The first recovery material 120a within the pits 114 comprising the depth of dimension $d_1$ or $d_2$, and the first recovery material 120a and the second recovery material 120b within the pits 114 comprising the depth of dimension $d_3$ advantageously create a substantially planar surface of the molding material 108, improving the formation of the interconnect structure 104e, and preventing the first dielectric layer 116 of the interconnect structure 104e from being formed within the pits 114.

Thus, in some of the embodiments illustrated in FIGS. 8 through 12, the additional second recovery material 120b provides a greater amount of recovery of the topography of the surface of a packaged semiconductor device 130 that includes the pits 114. The second recovery material 120b may be used as a back-up recovery process in some embodiments or applications wherein the first recovery material 120a does not result in substantially filling the pits 114, for example. In other embodiments, a thickness of a single recovery material 120 such as the recovery material 120 shown in FIGS. 2, 3, 6A, and 6B may be increased, and a viscosity of the material of the recovery material 120 and/or other properties of the material of the recovery material 120 may be fine-tuned and adjusted to achieve a substantial filling of the pits 114 with the recovery material, as another example.

Figure 13:
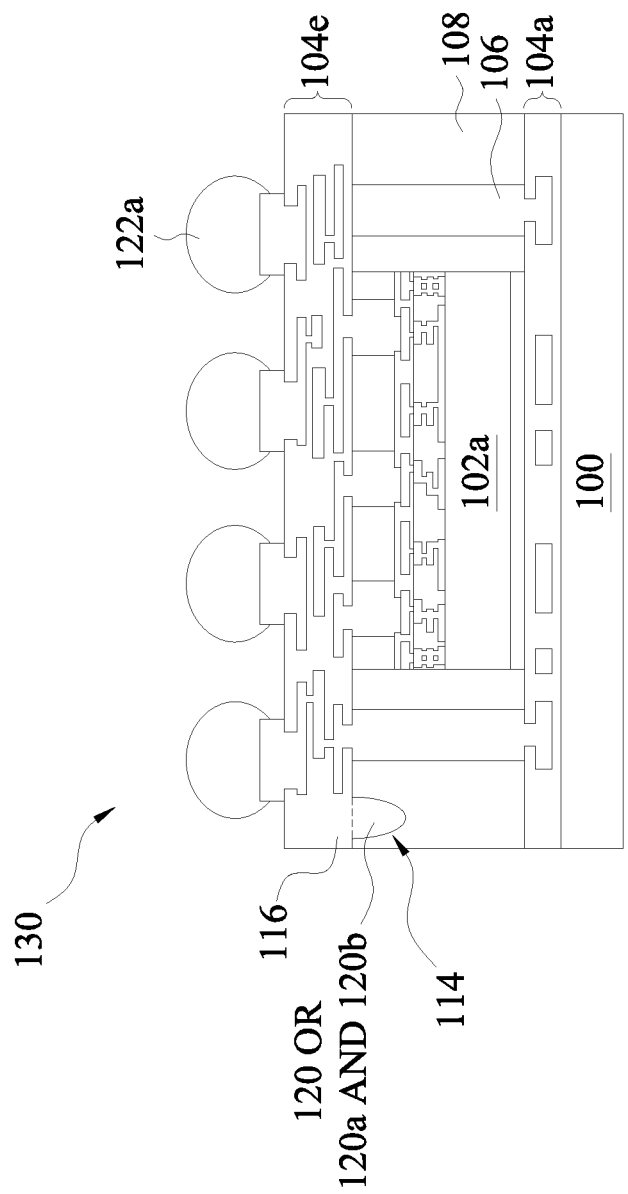
FIG. 13 and FIG. 14 illustrate cross-sectional views of a method of packaging semiconductor devices at various stages in accordance with some embodiments.
Figure 14:
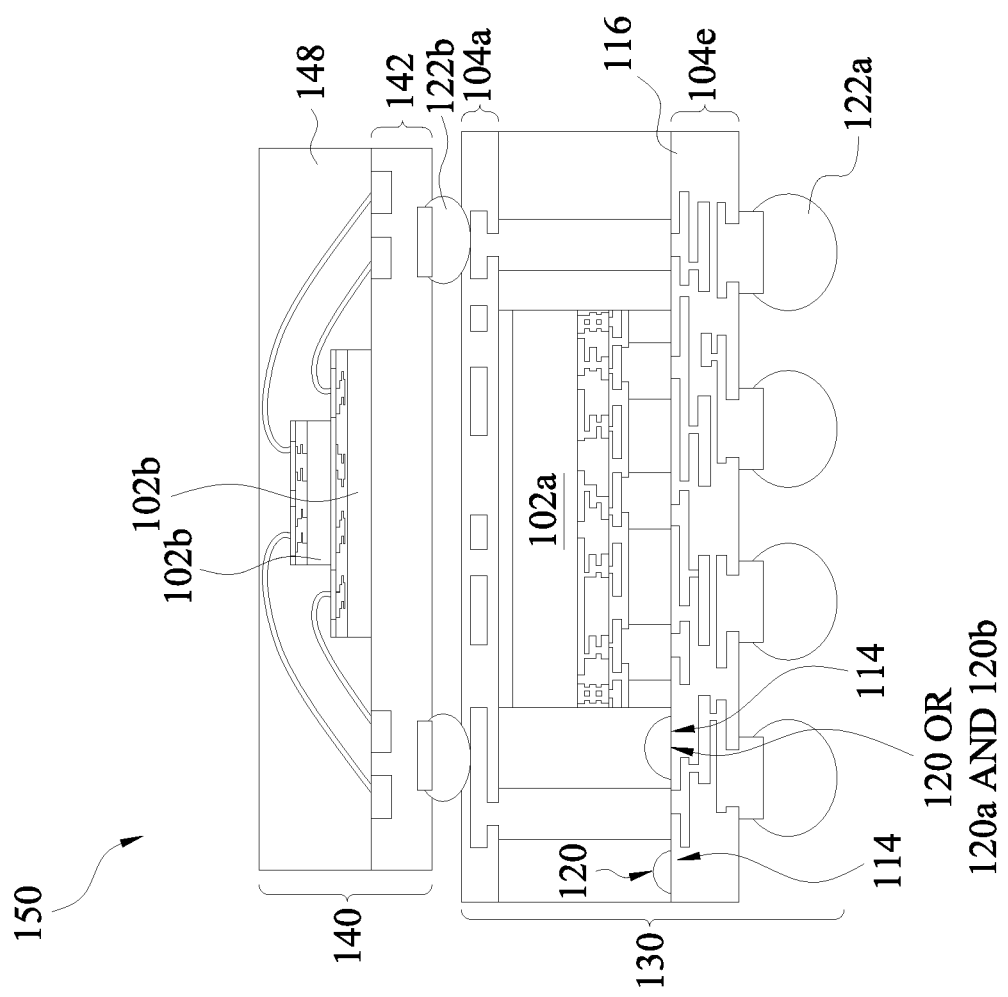

FIG. 13 and FIG. 14 illustrate cross-sectional views of methods of packaging semiconductor devices in accordance with some embodiments. In FIG. 13, a packaged semiconductor device 130 is shown that includes one or more integrated circuit dies 102a that have been packaged in accordance with some embodiments of the present disclosure. Pits 114 in the molding material 108 are filled with a recovery material 120 as described herein with reference to FIGS. 1 through 4, or the pits 114 in the molding material 108 are filled with a first recovery material 120a and a second recovery material 120b disposed over the first recovery material 120a as described herein with reference to FIGS. 8 through 12. The interconnect structure 104e is formed over the top surfaces of the molding material 108, the through-vias 106, the integrated circuit dies 102a, and the recovery material 120 or 120a and 120b. Connectors 122a are formed on portions of the interconnect structure 104e, such as contact pads. The packaged semiconductor devices 130 include the recovery material 120 or 120a and 120b described herein that substantially fills pits 114 in the molding material 108. The carrier 100 is then removed.

In some embodiments, the packaging device 130 that includes the recovery material 120 or 120a and 120b described herein that substantially fills pits 114 in the molding material 108 is coupled to another packaged semiconductor device 140 or packaged IC using a plurality of connectors 122b to form a POP device 150, as shown in FIG. 14 in a cross-sectional view.

Figure 15:
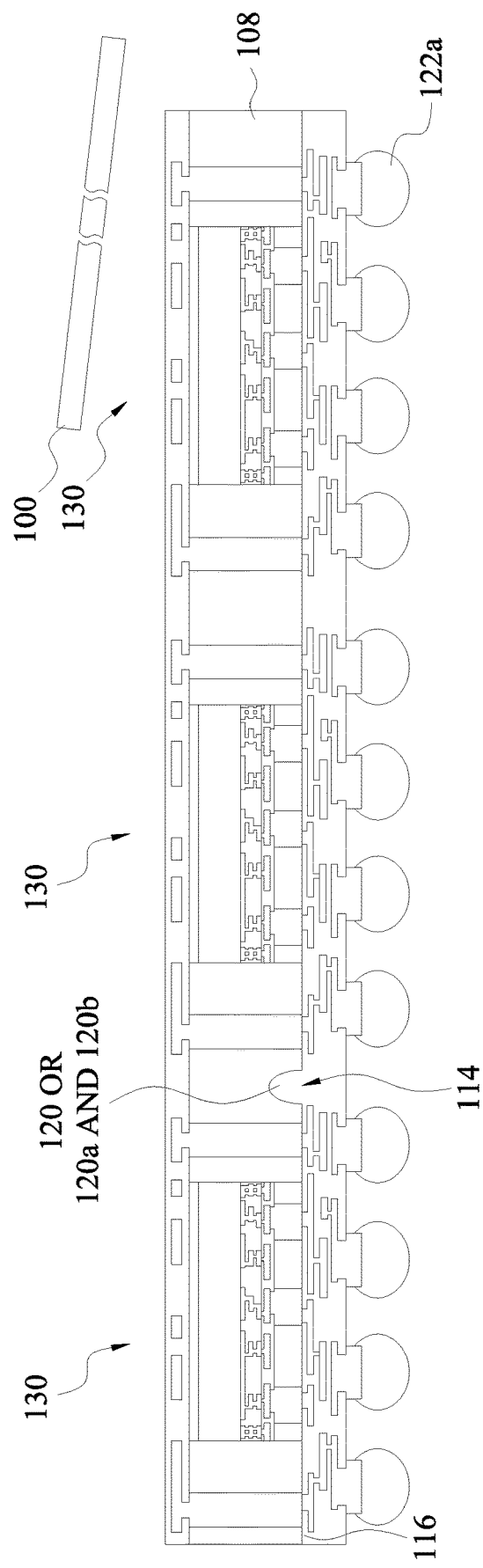
FIG. 15 through FIG. 17 illustrate cross-sectional views of a method of packaging semiconductor devices at various stages in accordance with some embodiments of the present disclosure.
Figure 16:
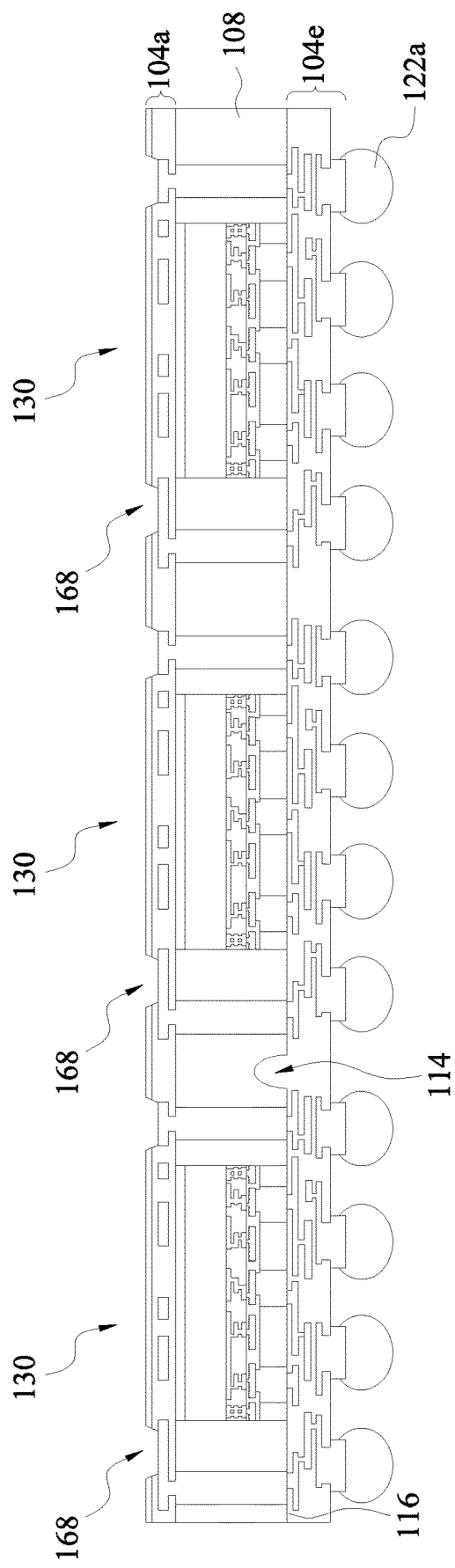
Figure 17:
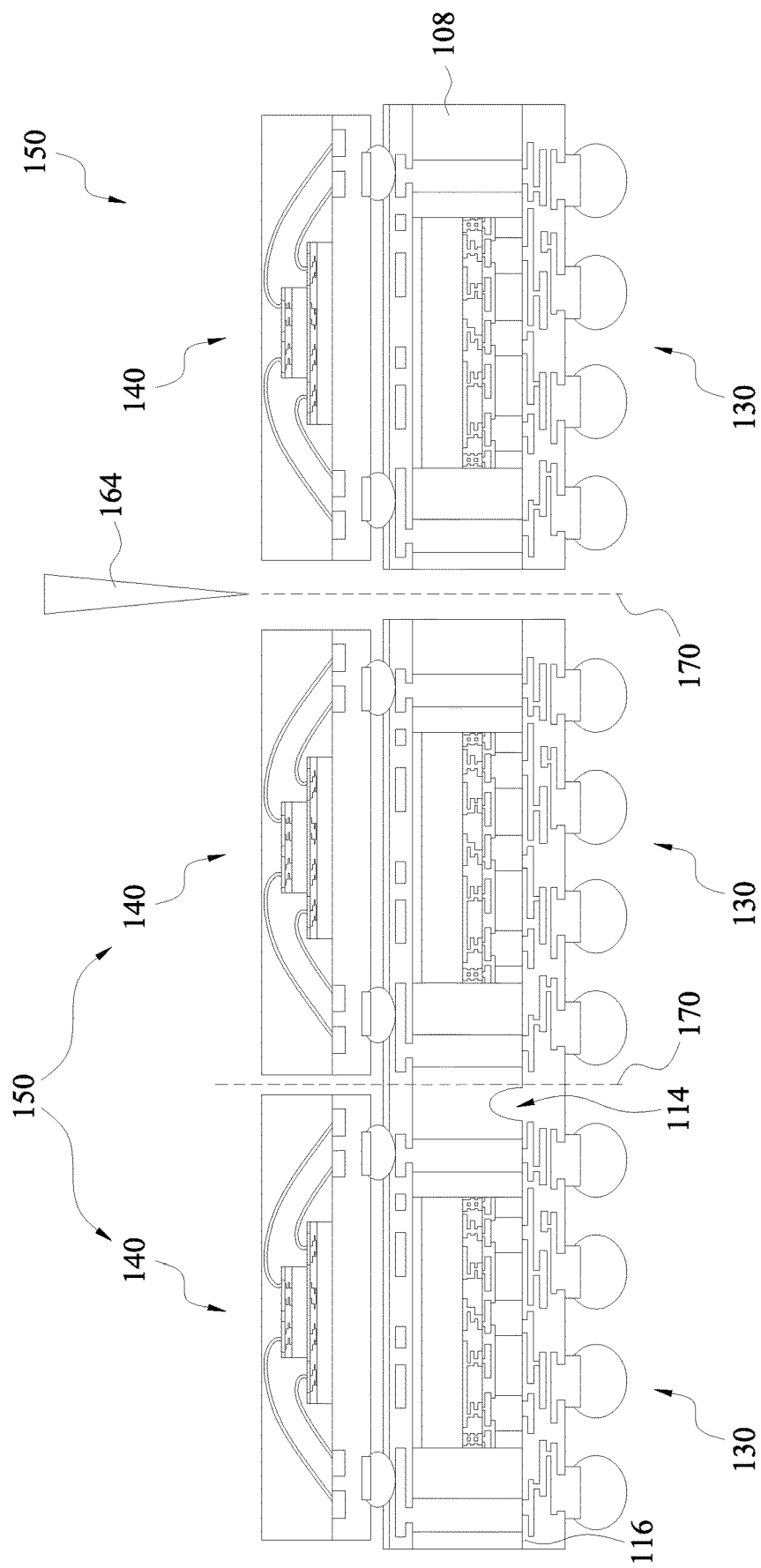

FIG. 15 through FIG. 17 illustrate cross-sectional views of a method of packaging semiconductor devices at various stages in accordance with some embodiments of the present disclosure. A plurality of packaged semiconductor devices 130 that include the recovery material 120 or 120a and 120b disposed in the pits 114 in the molding material 108 is simultaneously formed on the carrier 100, as shown in FIG. 15. The carrier 100 is then removed, also shown in FIG. 15. FIG. 16 illustrates openings 168 that may be formed within insulating material or materials of the first interconnect structure 104a of the first packaged semiconductor devices 130 so that electrical connections to second packaged semiconductor devices 140 may be made, as shown in FIG. 17. The openings may be formed using photolithography, a laser, or other methods. The POP devices 150 are then singulated using a saw 164 along scribe lines 170.

Figure 18:
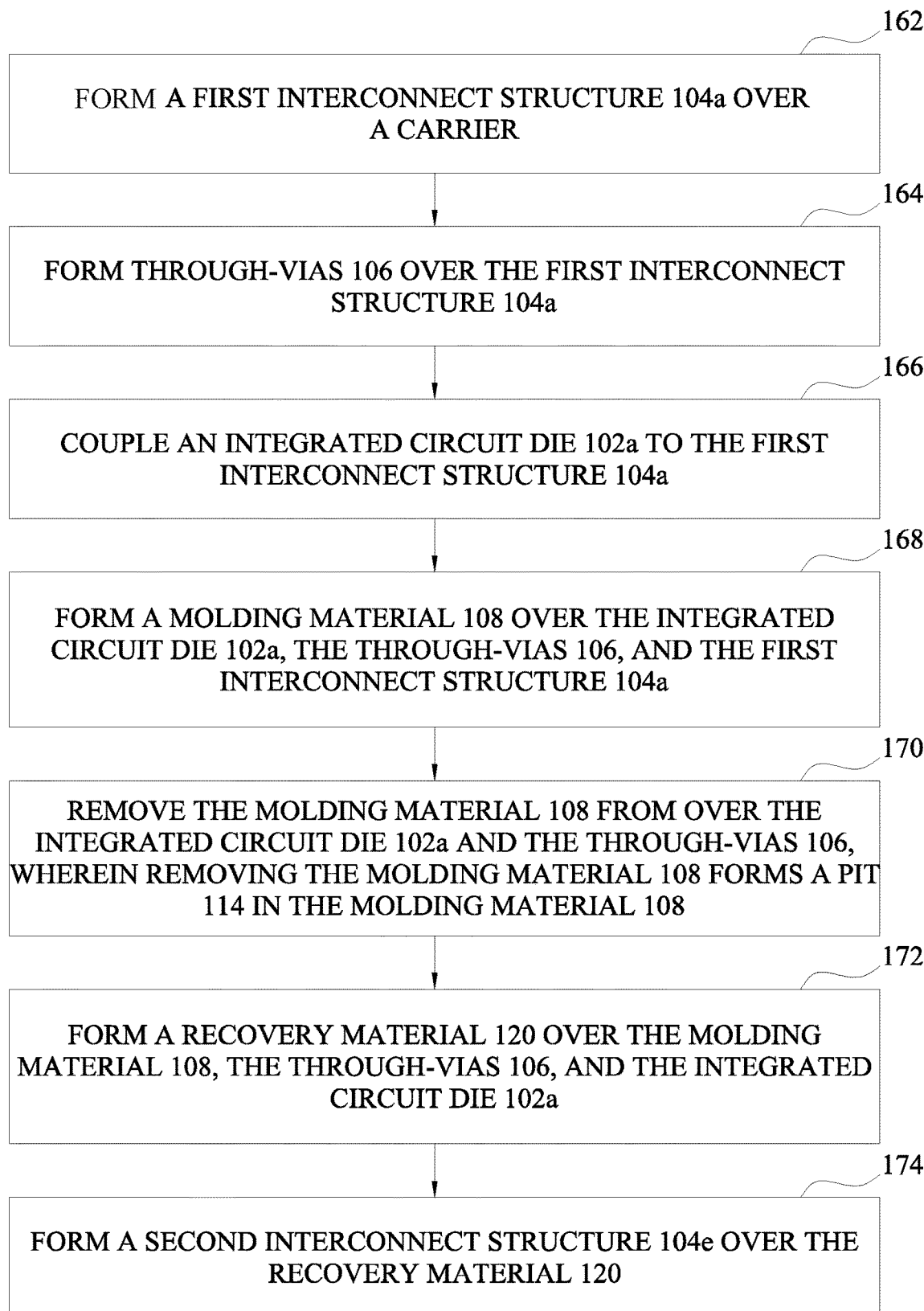
FIG. 18 is a flow chart of a method of packaging a semiconductor device in accordance with some embodiments.

FIG. 18 is a flow chart 160 of a method of packaging a semiconductor device in accordance with some embodiments. In step 162, a first interconnect structure 104a is formed over a carrier 100, such as the first interconnect structure 104a previously discussed with reference to FIG. 1. In step 164, a plurality of through-vias 106 is formed over the first interconnect structure 104a, and in step 166, an integrated circuit die 102a is coupled to the first interconnect structure 104a, also as discussed with reference to FIG. 1. In step 168, a molding material 108 is formed over the integrated circuit die 102a, the plurality of through-vias 106, and the first interconnect structure 104a, also as shown and described with reference to FIG. 1. In step 170, the molding material 108 is removed from over the integrated circuit die 102a and the plurality of through-vias 106, wherein removing the molding material 108 forms a pit 114 in the molding material 108, which is also shown in and described with reference to FIG. 1. In step 172, a recovery material 120 is formed over the molding material 108, the plurality of through-vias 106, and the integrated circuit die 102a, as discussed herein with reference to FIG. 2. In step 174, a second interconnect structure 104e is formed over the recovery material 120, as discussed with reference to FIGS. 3 and 4.

Embodiments of the present disclosure are advantageously implementable in and are particularly beneficial when used in POP devices, in some applications. The packaged semiconductor devices 150 may comprise POP devices, system-on-a chip (SOC) devices, chip-on-wafer-on-substrate (CoWoS) devices, or other types of 3DICs in some embodiments, as examples. Embodiments of the present disclosure are also beneficial for and may be implemented in other types of devices that include interconnect structures and fan-out structures, as other examples.

In some embodiments, the first integrated circuit dies 102a comprise logic devices or processors and the first packaged semiconductor devices 130 comprise fan-out wiring, and the second integrated circuit dies 102b comprise memory devices such as DRAM devices, e.g., in some embodiments wherein the molding material pit recovery material 120, 120a, and 120b described herein is implemented in an integration fan-out (InFO) POP device 150. In some embodiments, the second packaged semiconductor devices 140 include a plurality of stacked integrated circuit dies 102b comprising DRAM devices, for example. The first integrated circuit dies 102a, the second integrated circuit dies 102b, the first packaged semiconductor devices 130, and the second packaged semiconductor devices 140 may also comprise other types of devices, and the recovery materials and processes described herein may be implemented in other types of applications.

Some embodiments of the present disclosure include packaged semiconductor devices 130 and POP devices 150 that include the recovery material(s) 120 or 120a and 120b within pits 114 in the molding material 108. Other embodiments include methods of packaging semiconductor devices.

For example, referring again to FIG. 1, in accordance with some embodiments, a method of packaging a semiconductor device such as an integrated circuit die 102a includes forming a first interconnect structure 104a over a carrier 100, and forming through-vias 106 over the first interconnect structure 104a. The method includes coupling the integrated circuit die 102a to the interconnect structure 104a, and forming the molding material 108 over the integrated circuit die 102a, the through-vias 106, and the first interconnect structure 104a. A top portion of the molding material 108 is removed from over the integrated circuit die 102a and the through-vias 106 using a planarization process. The planarization process used to remove the top portion of the molding material 108 forms one or more pits 114 in the molding material 108. A recovery material 120 is formed over the molding material 108, the through-vias 106, and the integrated circuit die 102a, filling the pit(s) 114.

Some embodiments include forming a second interconnect structure 104e over the recovery material 120 (see FIG. 7). Other embodiments include first, removing the recovery material 120 from over the integrated circuit die 102a, the through-vias 106, and a surface of the molding material 108 using a planarization process, leaving the recovery material 120 residing in the pit(s) 114 in the molding material 108; and second, forming the second interconnect structure 104e over the molding material 108, the through-vias 106, the integrated circuit die 102a, and the recovery material 120 left residing in the pit(s) 114 (see FIG. 4).

In some embodiments, two layers of recovery material 120a and 120b are used to fill the pit(s) 114 in the molding material 108. After forming the first recovery material 120a over the surface of the molding material 108, the through-vias 106, and the integrated circuit die 102a, a planarization process is used to remove the first recovery material 120a from over the integrated circuit die 102a, the through-vias 106, and the surface of the molding material 108, which results in leaving a portion of the first recovery material 120a in a bottom region of the pit(s) 114. The method includes forming a second recovery material 120b over the first recovery material 120a in the pit(s) 114 in the molding material 108, the top surface of the molding material 108, the integrated circuit die 102a, and the through-vias 106. The second interconnect structure 104e is then formed over the second recovery material 120b after the packaging process stage shown in FIG. 11 in some embodiments. In other embodiments, after the second recovery material 120b is formed, a planarization process is used to remove the second recovery material 120b from over the integrated circuit die 102a, the through-vias 106, and the surface of the molding material 108, leaving the second recovery material 120b residing in the pit(s) 114 in the molding material 108 over the first recovery material 120a. The second interconnect structure 104e is then formed over second recovery material 120b in the pit(s) 114 in the molding material 108, the top surface of the molding material 108, the integrated circuit die 102a, and the through-vias 106, as illustrated in FIG. 13.

The planarization processes used for the various material layers, such as the molding material 108, the recovery material 120, the first recovery material 120a, and the second recovery material 120b may comprise etch processes, grinding processes, CMP processes, or combinations thereof.

Advantages of some embodiments of the present disclosure include providing packaging methods for POP devices and other types of 3DICs that implement recovery materials and methods for molding material pits. The recovery materials comprise polymer coatings that repair the pits in the molding material. The processes and recovery material thicknesses may be varied according to the depth of the pits in the molding material, to achieve an effective fill of the pits. The recovery material residing in the pits advantageously prevents a first dielectric layer of an interconnect structure from being formed within the pits in the molding material, improving the reliability of the interconnect structure. Shorts and/or breaks in electrical wiring of the interconnect structure are reduced or eliminated by the improved planarity of the underlying topography of material layers of the interconnect structures, such as the molding material. Yields and electrical function tests of packaged semiconductor devices are improved by providing a more planar surface for the formation of the interconnect structures. Prevention and reduction of missing conductive bridging; missing connections; and shorts and breaks in conductive wiring of the interconnect structures are achieved by filling the pits with the recovery materials described herein. The recovery materials may comprise the same or different materials as used for a subsequently formed dielectric layer of an interconnect structure. Furthermore, the packaging methods and structures described herein are easily implementable into existing packaging process flows and structures.

Some embodiments include a structure having a first die and an encapsulant laterally surrounding the first die. A first dielectric material is disposed within the encapsulant, the first dielectric material extending from a first surface of the encapsulant by a first distance into the encapsulant, the first dielectric material being a different material than the encapsulant. A first interconnect is disposed over the first surface of the encapsulant, the first interconnect physically contacting the first dielectric material.

Some other embodiments include a packaged semiconductor device having an integrated circuit die, a first interconnect structure coupled to the integrated circuit die, and a plurality of through-vias coupled to the first interconnect structure. A molding material is disposed over the first interconnect structure and around the integrated circuit die and the plurality of through-vias. The molding material includes a pit disposed therein. A dielectric material is disposed within the pit in the molding material, where the dielectric material is a different material than the molding material. A second interconnect structure is disposed over the molding material, the dielectric material, the integrated circuit die, and the plurality of through-vias.

Other embodiments includes a structure having a first packaged semiconductor device and a second packaged semiconductor device physically coupled to the first packaged semiconductor device. The first packaged semiconductor device includes a first die and a molding compound laterally disposed around the first die, encapsulating the first die. A first redistribution structure is disposed on a first side of the molding compound, where the first die is attached to the first redistribution structure by a die attach film. A second redistribution structure is disposed on a second side of the molding compound. The first packages semiconductor further includes a dielectric material disposed in the molding compound, the dielectric material extending from the second side of the molding compound into the molding compound. The dielectric material has a different material composition than the molding compound.

In some embodiments, a packaged semiconductor device includes an integrated circuit die, a first interconnect structure coupled to the integrated circuit die, and a plurality of through-vias coupled to the first interconnect structure. A molding material is disposed over the first interconnect structure and disposed around the integrated circuit die and the plurality of through-vias. The molding material includes a pit disposed therein. A recovery material is disposed within the pit in the molding material. A second interconnect structure is disposed over the molding material, the recovery material, the integrated circuit die, and the plurality of through-vias.

In other embodiments, a method of packaging a semiconductor device includes forming a first interconnect structure over a carrier, forming a plurality of through-vias over the first interconnect structure, and coupling an integrated circuit die to the first interconnect structure. A molding material is formed over the integrated circuit die, the plurality of through-vias, and the first interconnect structure. The molding material is removed from over the integrated circuit die and the plurality of through-vias, wherein removing the molding material forms a pit in the molding material. The method includes forming a recovery material over the molding material, the plurality of through-vias, and the integrated circuit die, and forming a second interconnect structure over the recovery material.

In yet other embodiments, a method of packaging a semiconductor device includes forming a first interconnect structure over a carrier, forming a plurality of through-vias over the first interconnect structure, and coupling an integrated circuit die to the first interconnect structure. A molding material is formed over the integrated circuit die, the plurality of through-vias, and the first interconnect structure, and the molding material is removed from over the integrated circuit die and the plurality of through-vias. Removing the molding material forms a plurality of pits in the molding material. A recovery material is formed over the molding material, the plurality of through-vias, and the integrated circuit die. The method includes removing a first portion of the recovery material from over the molding material, the plurality of through-vias, and the integrated circuit die, wherein removing the first portion of the recovery material leaves a second portion of the recovery material within the plurality of pits in the molding material. A second interconnect structure is formed over the second portion of the recovery material, the molding material, the plurality of through-vias, and the integrated circuit die, and the carrier is removed from the first interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing an encapsulant over an embedded die;
   planarizing an upper surface of the encapsulant, the planarizing causing a first pit in the upper surface of the encapsulant;
   depositing a recovery material in the first pit and over the upper surface of the encapsulant, the recovery material at least partially filling the first pit;
   forming a first insulating layer of a redistribution structure directly on the recovery material; and
   forming a first metal layer of the redistribution structure on the first insulating layer, the first metal layer coupled to a via embedded in the encapsulant.

2. The method of claim 1, wherein the recovery material has a second pit corresponding to a location of the first pit, the second pit being smaller than the first pit.

3. The method of claim 2, wherein the first insulating layer of the redistribution structure fills the second pit.

4. The method of claim 3, wherein the first insulating layer of the redistribution structure extends into the encapsulant.

5. The method of claim 1, further comprising:
   forming an opening in the recovery material, the opening exposing a conductive element, wherein the first metal layer contacts the conductive element.

6. The method of claim 5, wherein the conductive element is embedded in the encapsulant.

7. The method of claim 5, wherein the conductive element is electrically coupled to the embedded die.

8. The method of claim 1, wherein a thickness of the recovery material is the same as a depth of the first pit.

9. A method comprising:
   plating a conductive column on a first redistribution structure;
   attaching a backside of a die to the first redistribution structure, an active side of the die being face up;
   depositing a molding material laterally surrounding the die and the conductive column;
   planarizing the molding material, the planarizing forming a first pit in an upper surface of the molding material;
   depositing a recovery material in the first pit, the recovery material comprising a material different from the molding material; and
   forming a first layer of a second redistribution structure directly on the recovery material.

10. The method of claim 9, wherein depositing the recovery material causes a second pit to be formed in the recovery material at a location corresponding to the first pit, a depth of the second pit being less than a depth of the first pit, wherein a portion of the first layer of the second redistribution structure extends into the second pit.

11. The method of claim 10, wherein the depth of the second pit is greater than a thickness of the recovery material, wherein a portion of the first layer of the second redistribution structure extends into the molding material.

12. The method of claim 9, wherein the first pit has a first depth between 3 μm and 50 μm and a first width between 6.5 μm and 200 μm.

13. The method of claim 12, wherein depositing the recovery material causes a second pit to be formed in the recovery material at a location corresponding to the first pit, wherein a second depth of the second pit is less than the first depth and a second width of the second pit is less than the first width.

14. The method of claim 9, wherein the recovery material comprises a polymer.

15. The method of claim 9, wherein the recovery material is a second recovery material further comprising:
   depositing a first recovery material in the first pit prior to depositing the second recovery material; and
   planarizing the first recovery material to expose the upper surface of the molding material, a portion of the first recovery material remaining in the first pit, a second pit forming in the first recovery material at a location corresponding to the first pit, the second pit being smaller than the first pit, wherein the second recovery material is deposited in the first pit and the second pit.

16. A method comprising:
   encapsulating an integrated circuit die in a molding material;

planarizing the molding material, the planarizing creating a pit in the molding material, the pit having a first depth;

depositing a recovery material in the pit and over the molding material, the recovery material reducing a depth of the pit, the pit having a second depth; and forming a first interconnect structure coupled to the integrated circuit die, a portion of the first interconnect structure extending into the pit by the second depth, the recovery material interposed between the first interconnect structure and the molding material.

17. The method of claim 16, wherein the recovery material extends along a surface of the molding material, further comprising: electrically coupling the first interconnect structure through the recovery material to the integrated circuit die.

18. The method of claim 17, forming openings in the recovery material to expose conductive features of the integrated circuit die.

19. The method of claim 16, wherein the recovery material is deposited to a thickness between 5 μm and 50 μm.

20. The method of claim 16, wherein the first depth is between 3 μm and 50 μm.

* * * * *